United States Patent
Akiyama

(10) Patent No.: US 6,888,220 B2
(45) Date of Patent: May 3, 2005

(54) SEMICONDUCTOR DEVICE HAVING A BURIED WIRING LEAD STRUCTURE

(75) Inventor: Kazutaka Akiyama, Matsudo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/238,694

(22) Filed: Sep. 11, 2002

(65) Prior Publication Data

US 2003/0057558 A1 Mar. 27, 2003

(30) Foreign Application Priority Data

Sep. 12, 2001 (JP) .................................. 2001-276987

(51) Int. Cl.[7] .............................................. H01L 29/00
(52) U.S. Cl. ..................................... 257/532; 257/528
(58) Field of Search ................................ 257/296, 301, 257/303, 304, 306, 499, 528, 532, 741, 742, 750, 751, 752, 753, 754, 755, 756, 757, 758, 759, 760, 761, 762, 763, 764, 765, 766, 767, 768, 769–776

(56) References Cited

U.S. PATENT DOCUMENTS

| | | | | |
|---|---|---|---|---|
| 5,691,219 A | | 11/1997 | Kawakubo et al. | |
| 5,708,559 A | * | 1/1998 | Brabazon et al. | |
| 6,025,226 A | * | 2/2000 | Gambino et al. | |
| 6,037,206 A | * | 3/2000 | Huang et al. | |
| 2002/0022333 A1 | * | 2/2002 | Morand et al. | |

FOREIGN PATENT DOCUMENTS

| | | |
|---|---|---|
| JP | 2001-036010 | 2/1991 |
| JP | 2001-237375 | 8/2001 |

* cited by examiner

*Primary Examiner*—Nathan J. Flynn
*Assistant Examiner*—Kevin Quinto
(74) *Attorney, Agent, or Firm*—Oblon, Spivak, McClelland, Maier & Neustadt, P.C.

(57) ABSTRACT

A semiconductor device includes a semiconductor substrate, an insulative film formed above the semiconductor substrate, the film having a first groove and a second groove greater in width than the first groove, a wiring lead buried in the first groove of the insulative film to have a substantially flat surface, and a capacitor buried in the second groove of the insulative film to have a substantially flat surface, the capacitor having a multilayer structure including a first conductive film identical in material to the lead, a capacitor dielectric film, and a second conductive film.

17 Claims, 7 Drawing Sheets

SEMICONDUCTOR DEVICE HAVING A BURIED WIRING LEAD STRUCTURE

CROSS-REFERENCE TO RELATED APPLICATIONS

This application is based upon and claims the benefit of priority from the prior Japanese Patent Application No. 2001-276987, filed on Sep. 12, 2001, the entire contents of which are incorporated herein by reference.

BACKGROUND OF THE INVENTION

1. Field of the Invention

This invention relates generally to a semiconductor device and, more particularly, to a semiconductor device having a buried wiring lead (wire lead) structure. This invention also relates to methodology of fabricating a semiconductor device of the type employing the buried wiring lead structure.

2. Description of Related Art

Metal wiring lines or leads are used to achieve electrical interconnection among elements of a semiconductor integrated circuit (IC) chip. Traditionally such on-chip metal wiring leads are typically manufacturable by patterning a metal film made of aluminum (Al) or else as formed on or above an electrically insulative dielectric film using lithography and anisotropic etching techniques in combination. As the circuit elements decrease in size due to the quest for higher integration in the chip, the wiring leads are becoming smaller in line width and in marginal spacing (pitch). This miniaturization makes it difficult to bury a dielectric film in space between patterned leads. An approach to avoiding this difficulty is to make use of a damascene method in place of prior known Al lead formation methods. The damascene method is the one that processes or micromachines a dielectric film to form therein a wiring lead groove and then buries conductive material, such as copper (Cu) or the like, in this groove by metal plating techniques.

In addition, in cases where capacitive elements of large capacitance are required within IC chips, metal-insulator-metal (MIM) capacitors are employed from time to time in lieu of conventional silicon-insulator-silicon (SIS) capacitors. MIM capacitors are typically designed to have a lamination or multilayer structure of upper and lower metallic layers with a dielectric film interposed between them. Preferably in this case, electrodes of such MIM capacitors are fabricated at the same time that on-chip leads are formed.

See FIGS. 13 to 16. These diagrams illustrate, in cross-section, some of major steps in the process for simultaneously forming a MIM capacitor and its associative Cu wiring lead by the damascene method. The simultaneous MIM-capacitor/Cu-lead fabrication process has been disclosed, for example, in Published Unexamined Japanese Patent Application No. 2001-36010 ("JP-A-2001-36010"). Firstly, as shown in FIG. 13, a silicon substrate 1 is prepared. After a dielectric film 2 is formed on the substrate 1, use anisotropic etch techniques to form grooves 3a, 3b simultaneously in the dielectric film 2. The groove 3a is for use with a buried on-chip lead wire. The other groove 3b is in a capacitor region of substrate 1 and is for formation of an embedded capacitor. After having formed a barrier metal (not shown), form by Cu plating methods a wiring lead 4a and a capacitor lower electrode 4b so that these are buried in the wire groove 3a and capacitor groove 3b respectively as shown in FIG. 14. Then, form a capacitor dielectric film 5 made of silicon nitride (SiN) or the like and a capacitor upper electrode film 6 made of TIN or the like, which is laminated on the film 5. Next, sequentially apply etching to the upper electrode film 6 and capacitor dielectric film 5 to thereby form a capacitor as shown in FIG. 15. Thereafter as shown in FIG. 16, deposit an inter-layer dielectric (ILD) film 7 on the entire surface of resultant device structure. Then, again use the damascene method to form contact portions 8a, 8b and an upper-level wiring lead 9 as buried in the ILO film 7.

Unfortunately the prior art Cu-damascene method stated above is encountered with several problems which follow.

First, as shown in FIG. 15, the capacitor is formed in the state that it is projected from the surface of the dielectric film 2 on Si substrate 1. Accordingly, a need is felt to apply additional or extra planarization processing to the ILD film 7 shown in FIG. 16 once after this film is formed. In view of the fact that the initial Cu damascene wiring lead burying process per se requires planarization, at least two planarization steps are required in the process. Practically, chemical mechanical polishing (CMP) techniques are used for such planarization.

Second, as shown in FIG. 16, the contact portions 8a–8b associated with the upper-level wiring lead 9 are different in depth from each other. This depth difference can cause unwanted over-etching at a shallower one, i.e. contact 8b, during formation of contact holes in ILD film 7. To suppress etching at its underlayer, a significant etching selection ratio is required between the dielectric film and its underlying layer.

Third, the Cu lead 4a can unintentionally be oxidized on its surface exposed to a corresponding contact hole during formation of the upper lead 9's contact holes by anisotropic etching, which would result in an increase in electrical resistivity.

SUMMARY OF THE INVENTION

A semiconductor device in accordance with one aspect of this invention includes a semiconductor substrate, an insulative film formed above the semiconductor substrate, the film having a first groove and a second groove greater in width than the first groove, a wiring lead buried in the first groove of the insulative film to have a substantially flat surface, and a capacitor buried in the second groove of the insulative film to have a substantially flat surface, the capacitor having a multilayer structure including a first conductive film identical in material to the lead, a capacitor dielectric film, and a second conductive film.

A method of fabricating a semiconductor device in accordance with another aspect of the invention includes forming a first groove in a wiring region of an insulative film overlying a semiconductor substrate while forming in a capacitor region a second groove greater in width than the first groove, depositing a first conductive film above the insulative film with the first groove and the second groove formed therein in such a way that the first conductive film is buried in the first and second grooves to fully fill the first groove while partially filling the second groove to a level between a bottom and a top of the second groove, depositing a capacitor dielectric film above the first conductive film so that the capacitor dielectric film is buried in the second groove to partially fill the second groove, depositing a second conductive film above the capacitor dielectric film so that the second conductive film is buried in the second groove to fully fill the second groove, and polishing the second conductive film, the capacitor dielectric film and the first conductive film until exposure of the insulative film to thereby form a wiring lead with the first conductive film buried in the first groove while forming a capacitor with the first conductive film, the capacitor dielectric film and the second conductive film buried in the second groove.

A semiconductor device in accordance with still another aspect of the invention includes a semiconductor substrate, an insulative film formed above the semiconductor substrate, the film having a wiring groove with a widened contact portion formed therein, and a wiring lead with a first conductive film buried in the wiring groove, wherein the wiring lead has a structure with a second conductive film selectively covering an upper surface of the first conductive film at a central part of the contact portion and with the first conductive film being substantially planarly buried in the wiring groove at remaining part other than the contact portion.

A semiconductor device fabrication method in accordance with yet another aspect of the invention includes forming in an insulative film above a semiconductor substrate a groove having a wiring lead portion and a contact portion as continued thereto, the contact portion being greater in width than the wire lead portion, depositing above the insulative film with the groove formed therein a first conductive film in such a way that the first conductive film is buried in the groove to fully fill the wiring lead portion while partially filling the contact portion, depositing above the first conductive film a second conductive film so that the second conductive film is buried to fully fill the contact portion, and polishing the second conductive film and the first conductive film to thereby form a wiring lead with the first conductive film buried in the wiring lead portion and with a multilayer of the first and second conductive films buried in the contact portion.

DETAILED DESCRIPTION OF THE INVENTION

Some illustrative embodiments of this invention will be explained in detail with reference to the accompanying drawings below.

Embodiment 1

Figure 1A:
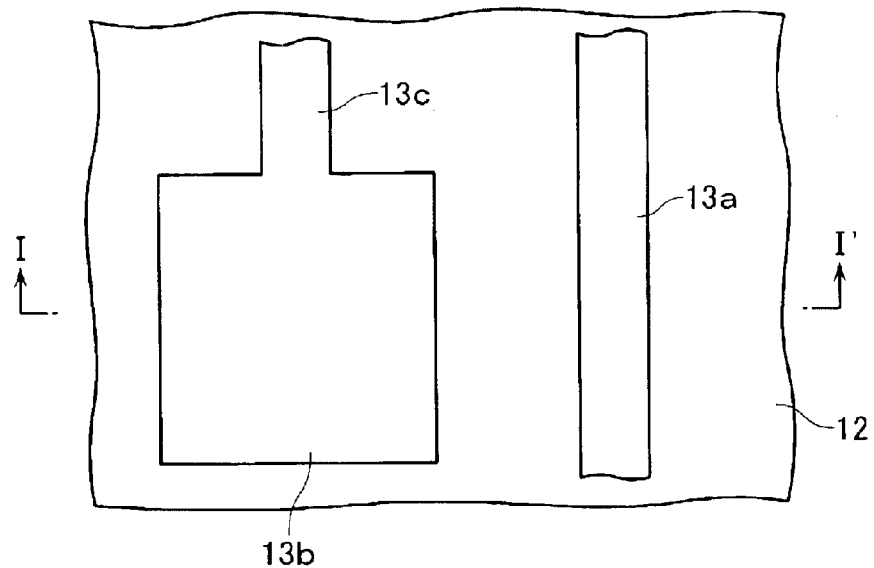
FIG. 1A is a diagram showing a top plan view of main part of a semiconductor device at a groove formation process step in accordance with an embodiment of this invention.
Figure 1B:
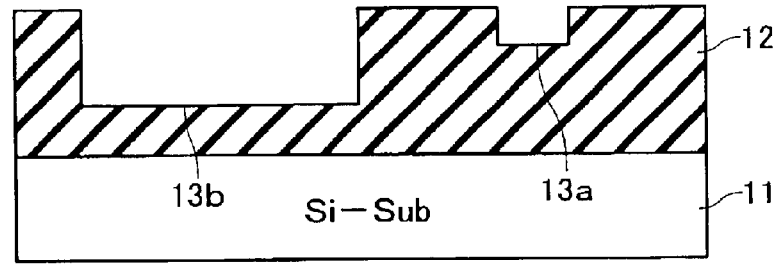
FIG. 1B is a cross-sectional view of the device as taken along line I–I' of FIG. 1A.

A semiconductor integrated circuit (IC) device in accordance with one embodiment of the invention is shown in FIGS. 1A and 1B, in the form of an intermediate product thereof. FIG. 1A illustrates a top plan view of a silicon(Si) substrate 11 having its top surface on which a dielectric insulating film 12 is formed whereas FIG. 1B depicts a cross-sectional view as taken along line I–I' of FIG. 1A. The dielectric film 12 is made of silicon oxide or other similar suitable insulative materials. As better shown in FIG. 1B, dielectric film 12 has a groove 13a in a wiring region and a groove 13b in a capacitor region. The capacitor groove 13b is greater in width and in depth than the wiring lead groove 13a. Accordingly, forming these grooves 13a–13b requires two lithography processes and anisotropic etching treatment such as reactive ion etching (RIE).

Practically as an example, the wiring lead groove 13a is arranged to measure 0.2 micrometers ($\mu$m) in width and 0.4 $\mu$m in depth. The capacitor groove 13b is designed to have its width which falls within a range of from about 10 to 100 $\mu$m, although it differs depending upon the required capacitance value on a case-by-case basis. Capacitor groove 13b has a depth that is set at an appropriate value required for the entirety of such capacitor. Additionally, as shown in FIG. 1A, another lead groove 13c is formed in dielectric film 12 in its selected region which becomes an extension lead portion from a lower or "bottom" electrode of the capacitor. This groove 13c is similar in width and depth to lead groove 13a.

Figure 2:
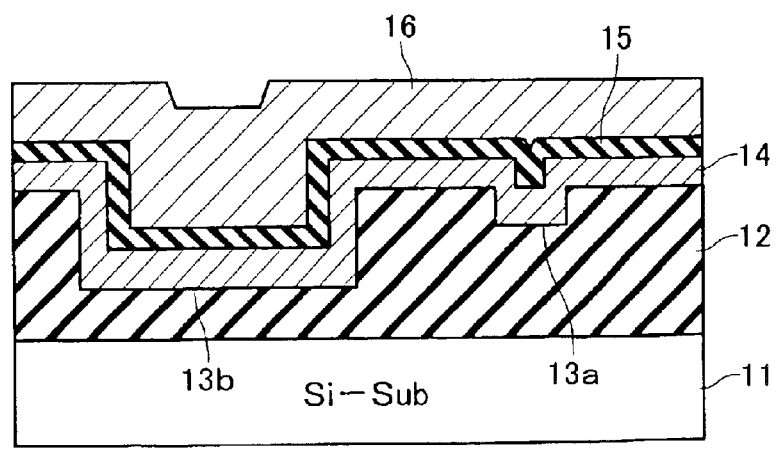
FIG. 2 is a sectional diagram showing a step of forming a multilayer structure consisting of upper and lower conductive films with a capacitor dielectric film interposed therebetween in accordance with the embodiment.

Thereafter, as shown in FIG. 2, a first conductive film 14 and a capacitor dielectric film 15 plus a second conductive film 16 are sequentially deposited on the structure of FIG. 1B. The first conductive film 14 may be a copper (Cu) film as formed by metal plating methods. A practically implementable example is that prior to metal plating, deposit a tantalum nitride (TaN) film for use as a barrier metal film (not shown) and a Cu film (not shown) by physical vapor deposition (PVD) techniques; then, let the Cu film be plated with these films as an electrode therefor. The first conductor film 14 is thick enough to completely fill the lead groove 13a; practically, its thickness is set greater than or equal to the depth of lead groove 13a. The capacitor groove 13b is set in the state that this groove is partially filled with the first conductor film 14 in a level between a bottom and a top of capacitor groove 13b. In other words, film 14 is half buried in capacitor groove 13b so that it fills groove 13b merely to an intermediate level along the depth of this groove.

The capacitor dielectric film 15 is a silicon nitride (SiN) film with a thickness of approximately 0.1 μm, by way of example. The second conductor film 16 may be a titanium nitride (TiN) film with a thickness of about 0.15 μm. These films are deposited by chemical vapor deposition (CVD) techniques. The process condition required here is that the capacitor groove 13b is not fully filled with the buried films in a direction along the depth thereof even when the deposition of capacitor dielectric film 15 is completed.

Figure 3A:
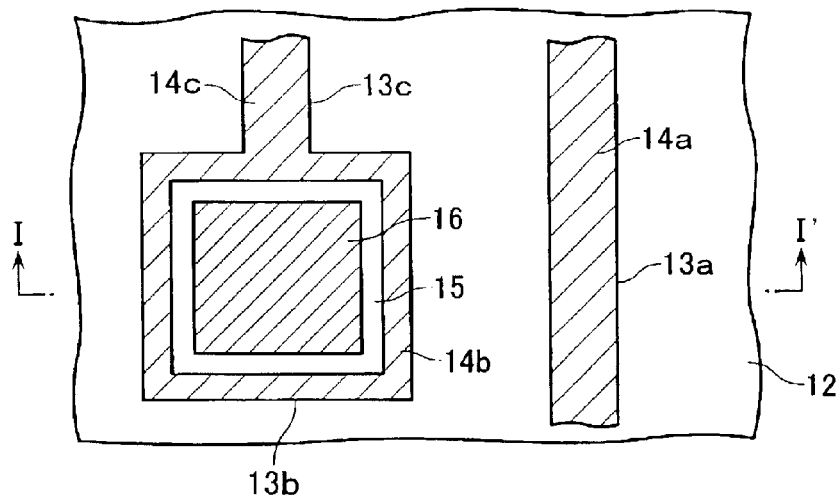
FIG. 3A is a plan view diagram showing a planarization step in the process of the embodiment.
Figure 3B:
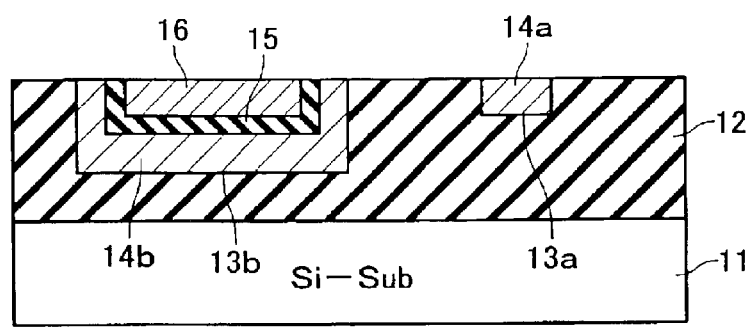
FIG. 3B is a sectional view taken along line I–I' of FIG. 3A.

Thereafter, the device structure of FIG. 2 is subject to planarization processing. More specifically, apply chemical mechanical polishing (CMP) to the second conductor film 16, capacitor dielectric film 15 and first conductor film 14 to the extent that the surface of dielectric film 12 is exposed. The resulting structure is shown in FIGS. 3A and 3B, wherein FIG. 3A is a plan view whereas FIG. 3B is a sectional view taken along line I–I' of FIG. 3A. The "narrow" lead groove 13a is planarly filled with a buried wiring lead 14a which consists of the first conductor film 14 alone. A capacitor is planarly buried in the "wide" capacitor groove 13b. This capacitor is structured from a lower-level electrode 14b formed of the first conductor film 14, an intermediate insulator film (capacitor dielectric film) 15, and an upper electrode formed of the second conductor film 16. The capacitor's lower electrode 14b is associated with a wiring lead 14c coupled thereto. The lead 14c is formed of only the first conductor film 14 in a similar manner to the lead 14a. Second conductive film 16 has its top surface which is the same in level as that of lead 14a. Thus their top surfaces are coplanar with each other. First conductor film 14 (i.e. capacitor lower electrode 14b) within groove 13b exhibits a recessed shape in cross-section. Similarly capacitor dielectric film 15 has a recessed cross-sectional shape. In other words, each buried film 14, 15 generally resembles the letter "U" in its cross-section shape.

Figure 4:
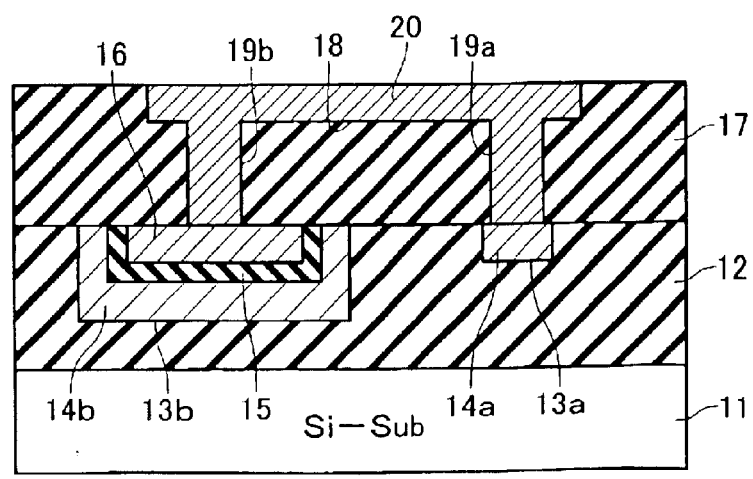
FIG. 4 is a sectional diagram showing an upper-level wiring lead formation step of the embodiment.

Subsequently, after having formed a Cu diffusion preventing insulator film (not shown) when the need arises, deposit an interlayer dielectric (ILD) film 17 as shown in FIG. 4. Then, define in the ILD film 17 a wiring lead groove 18 along with through-going openings for use as contact holes 19a, 19b, by anisotropic etch techniques such as RIE. Next, bury a third conductive film 20 in the lead groove 18 and contact holes 19a–19b. This third conductor film 20 also is a Cu film manufacturable by metal plating methods. Specifically, after having deposited a not-depicted TaN film and Cu film by PVD methods, apply plating to the Cu film with these films as an electrode therefor. Note that contact hole 19b is substantially the same in depth as contact hole 19a.

With the illustrative embodiment, as the capacitor and the wiring leads are planarly buried in the grooves, the ILD film 17 shown in FIG. 4 does no longer call for any planarization processing. Thus, the planarization steps required in the process decreases in number as compared to the prior art discussed in the introductory part of the description. Furthermore the capacitor of this embodiment is not projected from the dielectric film 12. Resulting in the contact holes 19a–19b of FIG. 4 becoming the same in depth as each other, the contact holes are definable without suffering from any risks of over-etching damages.

Embodiment 2

While in the first embodiment (Embodiment 1) the wiring lead groove and capacitor groove are made different in depth from each other, a similar structure is obtainable even when the grooves are modified to be identical in depth to each other. An embodiment employing this approach will next be discussed in conjunction with FIGS. 5 to 8 below. Note that like parts and parts performing similar functions in this embodiment are designated by like reference numerals used in the previous embodiment.

Figure 5:
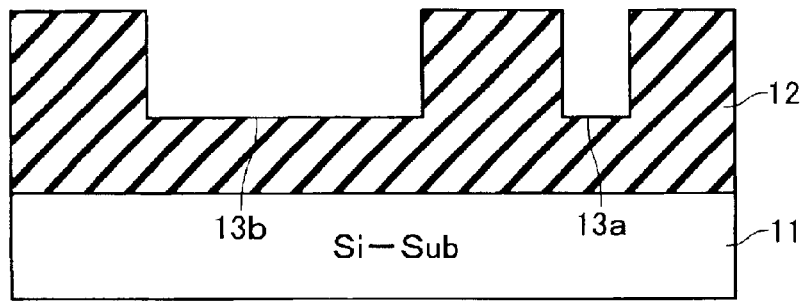
FIG. 5 is a sectional diagram showing a groove formation step in accordance with another embodiment of the invention.

As shown in FIG. 5, prepare a silicon substrate 11 having a top surface on which a dielectric film 12 is formed. Then, define in the dielectric film 12 a groove 13a in which a wiring lead is to be buried and a groove 13b in which a capacitor is to be buried. The wiring lead groove 13a is designed to measure about 0.2 μm in width. The capacitor groove 13b has its width which ranges from about 10 to 100 μm as required to provide the capacitance value required. Grooves 13a–13b are set at substantially the same depth value that is necessary for burying the entirety of a capacitor in groove 13b—for example, 0.4 μm or more or less. Thus, these grooves 13a–13b are defined by a single step of anisotropic etching.

Figure 6:
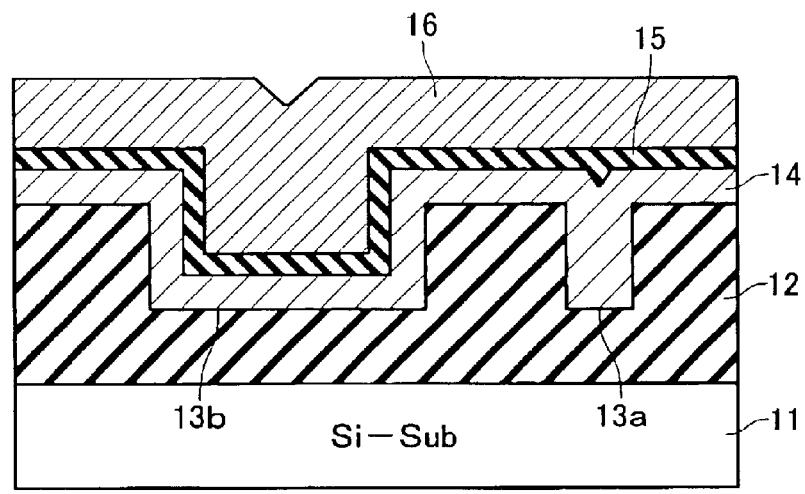
FIG. 6 is a sectional diagram showing a step of forming a multilayer structure which consists of conductive films with a capacitor dielectric film sandwiched therebetween in accordance with the same embodiment.

Thereafter, as shown in FIG. 6, sequentially deposit on the structure of FIG. 5 a first conductive film 14 and a capacitor dielectric film 15 and also a second conductive film 16 in this order of sequence. First conductor film 14 may be a metal-plated Cu film. Specifically, prior to plating, a TaN film (not shown) and Cu film (not shown) are deposited by PVD techniques; then, with these films as an electrode, let the Cu film undergo plating process. First conductor film 14 is buried in lead groove 13a in such a way as to fully fill this groove. One practicable approach is to deposit film 14 to a prespecified thickness equal to or greater than ½ of the width of lead groove 13a. Note here that lead groove 13a is like a narrow deep trench and thus is less in film burying ability, also known as "embeddability" among those skilled in the art. To enhance the embeddability, add a chosen burying/ Inlay accelerating agent to plating solution to thereby force conductor to be well buried in lead groove 13a to completely fill this groove. For capacitor groove 13b, let it be partly filled with first conductor film 14 buried therein as shown in FIG. 6.

An example of the capacitor dielectric film 15 is a SiN film with a thickness of about 0.1 μm. The second conductor film 16 may be a TiN film which is about 0.15 μm thick. These films are deposited by CVD methods. The process condition required here is that even at the stage that the capacitor dielectric film 15 has been deposited, the capacitor groove 13b is not yet fully filled with the buried film 15 in the direction along the depth thereof.

Figure 7:
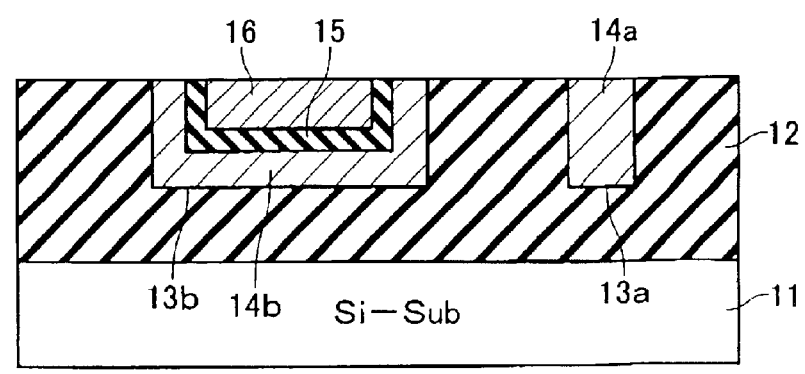
FIG. 7 is a sectional diagram showing a planarization process step of the embodiment.

The resultant structure of FIG. 6 is then subject to planarization processing. More specifically, as shown in FIG. 7, polish the second conductor film 16 and capacitor dielectric film 15 plus first conductor film 14 by CMP techniques until the surface of dielectric film 12 is exposed. The result of this polishing is that a wiring lead 14a which consists of the first conductor film 14 only is planarly buried in the narrow trench-like lead groove 13a. A capacitor is buried planarly in the capacitor groove 13b. This capacitor is structured from a lower electrode 14b formed of first conductor film 14, capacitor dielectric film 15, and upper electrode formed of second conductor film 16.

Figure 8:
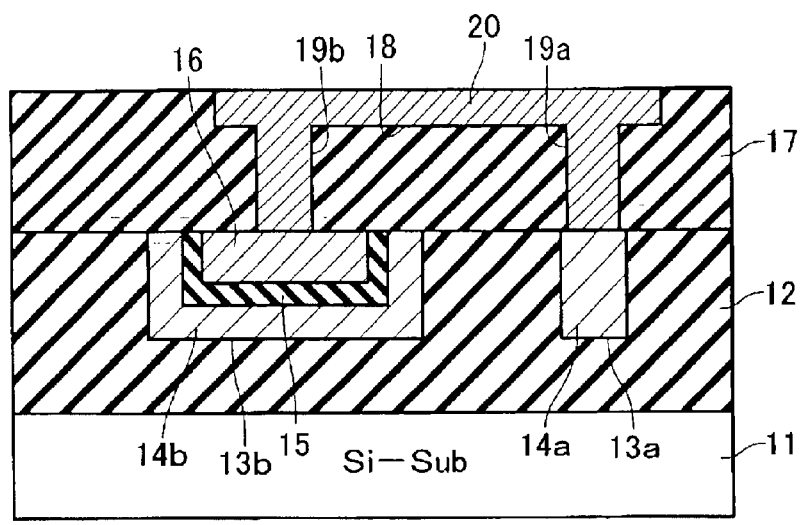
FIG. 8 is a sectional diagram showing an upper-level lead formation step of the embodiment.

Subsequently, after having formed a Cu outdiffusion preventing dielectric film (not shown) as circumstances demand, deposit an ILD film 17 as shown in FIG. 8. Then, define in this ILD film an upper-level wiring lead groove 18 and contact holes 19a, 19b by anisotropic etch techniques. Next, bury a third conductive film 20 in groove 18 and contact holes 19a–19b. This third conductor film 20 may also be a metal-plated Cu film. Specifically, after having deposited a TaN film (not shown) and Cu film (not shown) by PVD methods, apply metal plating to the Cu film with these as an electrode therefor.

With this embodiment also, as both the capacitor and its associated wiring lead(s) are buried planarly in the grooves, the ILD film 17 shown in FIG. 8 calls for no extra planarization processing. Accordingly, the fabrication process decreases in requisite number of planarization steps as a whole when compared to the prior art. In addition, since the buried capacitor thus formed has no portions projected from the dielectric film 12 on Si substrate 11, the contact holes 19a–b shown in FIG. 8 stay identical in depth to each other. This in turn makes it possible to achieve successful contact-hole formation without suffering from damages due to overetching.

Embodiment 3

Figure 9A:
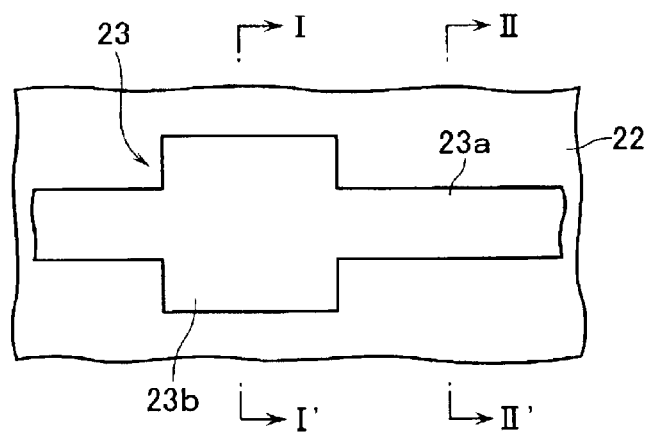
FIG. 9A is a plan view diagram showing a groove formation step in the process in accordance with still another embodiment of the invention.
Figure 9B:
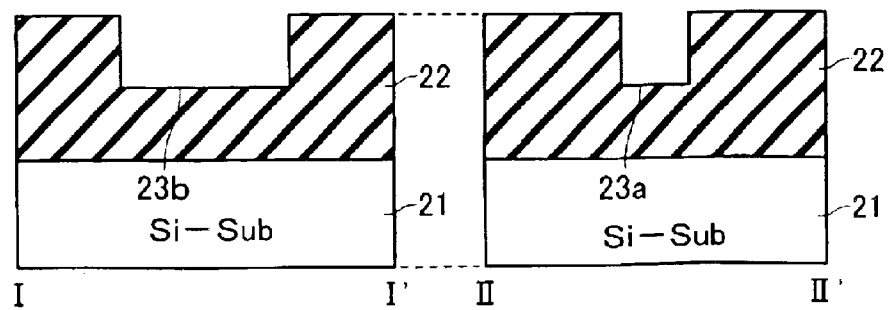
FIG. 9B depicts a cross-sectional view taken along line I–I' of FIG. 9A and a cross-section along line II–II' of it.

An explanation will next be given of an embodiment which is capable of precluding oxidation at wiring lead contact portions with reference to FIGS. 9A to 12 below. The oxidation at contacts poses problems for Cu damascene wiring leads. FIG. 9A illustrates a plan view of a semiconductor IC intermediate product obtained at a wiring lead formation step; FIG. 9B depicts its two cross-sectional views as taken along line I–I' and II–II' of FIG. 9A, respectively. As shown herein, define wiring lead grooves 23 (23a, 23b) by anisotropic etch techniques in a dielectric film 22 which is formed on a silicon substrate 21. The groove 23a is for use with a lead portion whereas the groove 23b is at a contact portion. The contact groove 23b is wider than lead groove 23a while these are the same in depth as each other.

Figure 10:
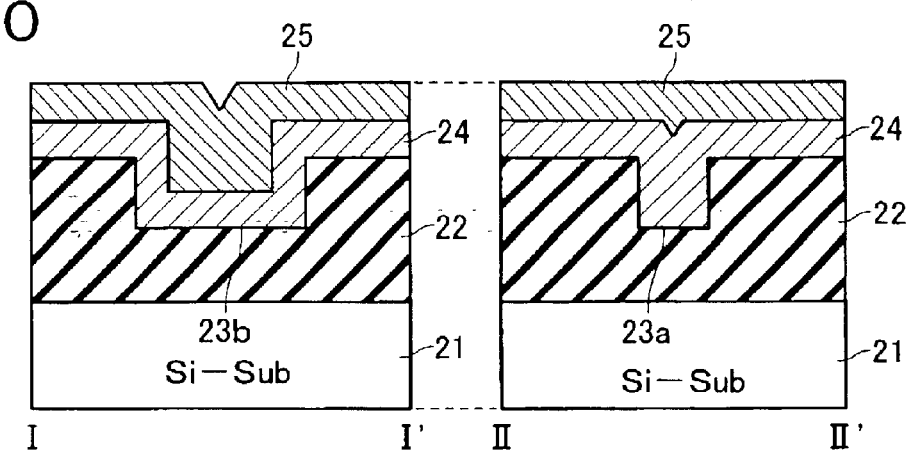
FIG. 10 is a sectional diagram showing a conductive film lamination step of the embodiment.

Thereafter, as shown in FIG. 10, deposit a first conductive film 24 for use as a wiring lead. Further deposit a second conductive film 25 with enhanced resistance against oxidation—that is, excellent in oxidation resistivity or "durability." The first conductor film 24 may be a metal-plated Cu film. One example is that prior to plating, a TaN film (not shown) and Cu film (not shown) are deposited by PVD techniques; then, with these films as an electrode, apply plating to the Cu film. The first conductor film 24 is buried to fully fill the lead groove 23a while partially or half filling the contact groove 23b. The second conductor film 25 is a TiN film formed by CVD methods, as an example.

Figure 11A:
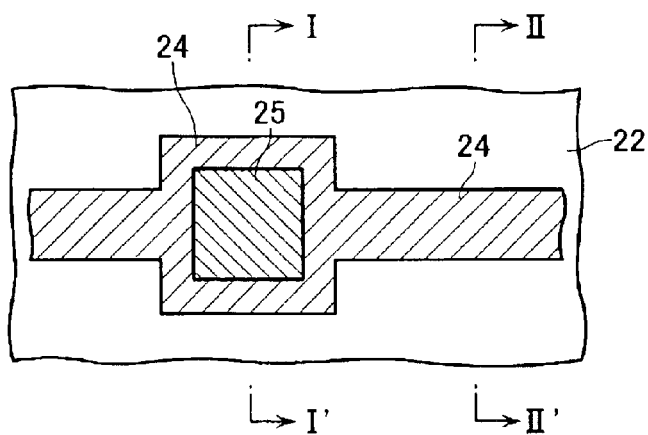
FIG. 11A is a plan view diagram showing a planarization step of the embodiment.
Figure 11B:
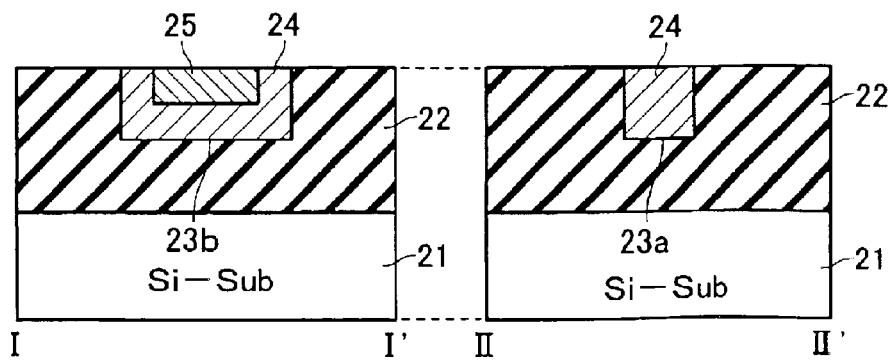
FIG. 11B shows a sectional diagram showing the planarization step of the embodiment.

Thereafter, apply planarization processing to the resultant device structure. More specifically, use CMP methods to polish the second conductor film 25 and first conductor film 24 until the surface of dielectric film 22 is exposed as shown in FIGS. 11A and 11B. The result of this CMP process is that a wiring lead consisting of first conductor film 24 alone is planarly buried in the contact groove 23a narrow in width. The contact groove 23b of increased width is such that a rectangular vessel-like layer of first conductor film 24 is buried therein, having a substantially centrally defined square recess which is filled with a thin dice-like "island" of the second conductor film 25 as selectively left therein. Second conductor film 25 at this contact portion has its upper or top surface which is at the same level as—thus, flush or coplanar with—a top surface of first conductor film 24 at the remaining part other than the contact. As better shown in FIG. 11B the first conductor film 24 at the contact has a "U"-shaped cross-section; more precisely, the cross-section of film 24 is like a square bracket ("[") counter-clockwise rotated by an angle of 90 degrees.

Figure 12:
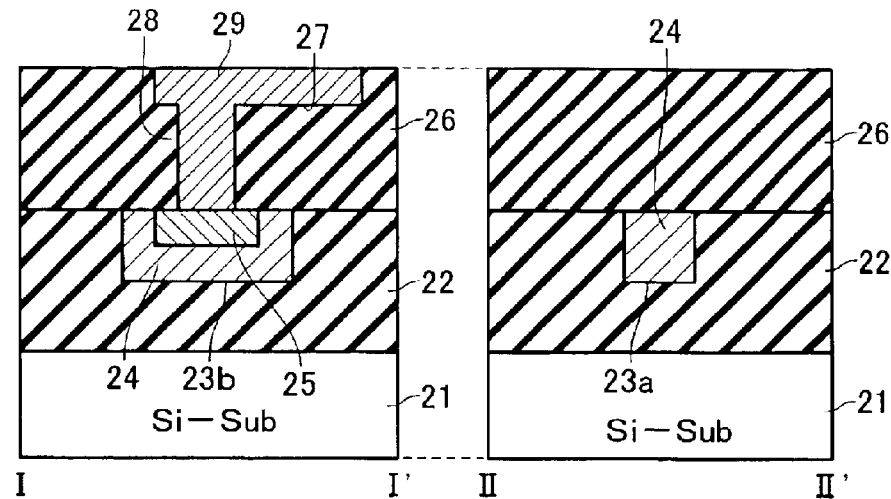
FIG. 12 is a sectional diagram showing an upper lead formation step of the embodiment.
Figure 13:
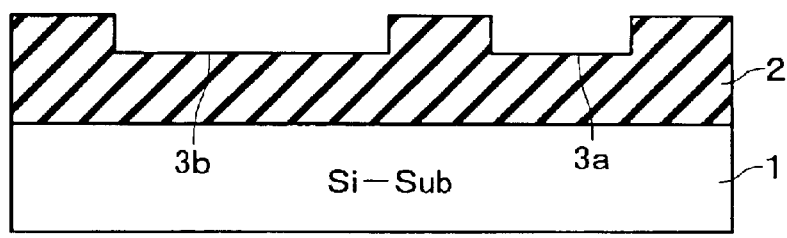
FIG. 13 is a sectional diagram showing a wiring lead formation step in one prior art process.
Figure 14:
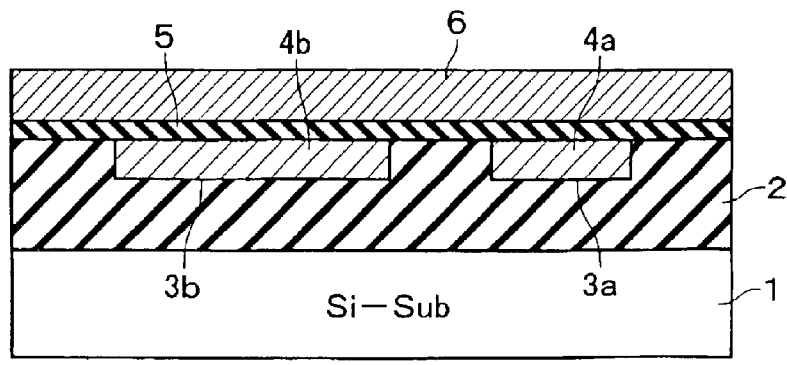
FIG. 14 is a sectional diagram showing a step of laminating conductive films with a capacitor dielectric film sandwiched therebetween in the prior art process.
Figure 15:
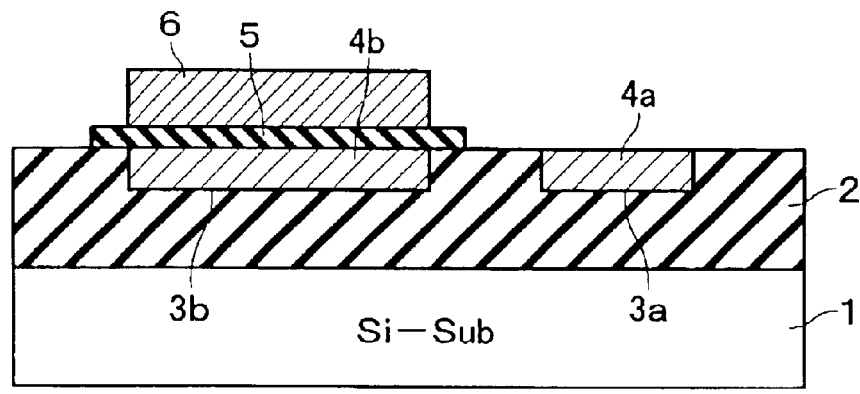
FIG. 15 is a sectional diagram showing a capacitor formation step in the prior art process.
Figure 16:
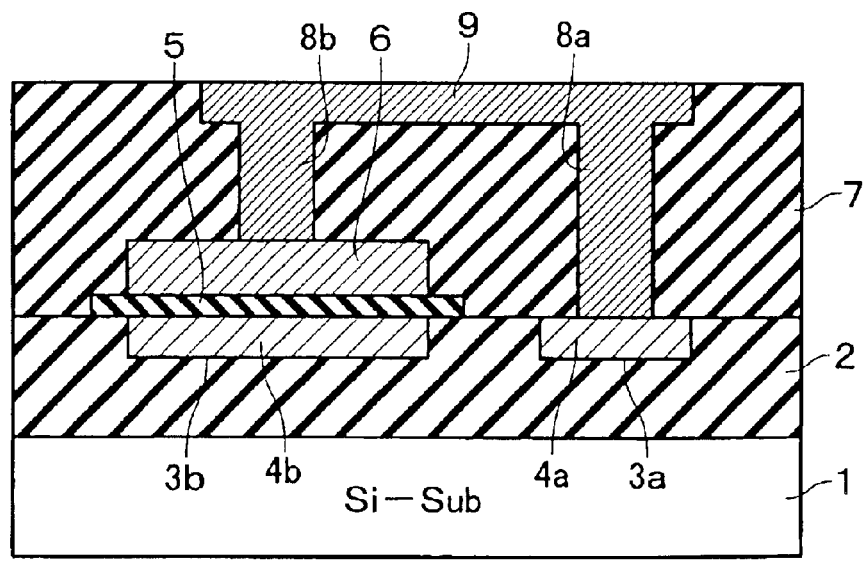
FIG. 16 is a sectional diagram showing an upper-level lead formation step in the prior art process.

After having formed a Cu diffusion preventing dielectric film (not shown) when the need arises, deposit an ILD film 26 as shown in FIG. 12. Then, define in this ILD film a wiring lead groove 27 and its associated contact hole 28 by anisotropic etch techniques. Next, bury a third conductive film 29 therein. This third conductor film 29 may also be a metal-plated Cu film. An example is that after having PVD-deposited a TaN film (not shown) and Cu film (not shown), apply metal plating to the Cu film with these as an electrode. The contact hole 28 is such that a conductor film for electrical connection to the contact portion is to be buried. Contact hole 28 has its diameter less than the width of its underlying second conductor film 25 that is centrally buried in contact groove 23b of dielectric film 22 on Si substrate 21.

As apparent from the foregoing, with this embodiment, it is possible to form the required TiN film excellent in oxidation resistivity only at the Cu-lead contact portion. This makes it possible to successfully prevent any unwanted oxidation of Cu wiring leads after completion of the formation of contact holes, thus enabling achievement of low resistance contacts with increased stability and enhanced reliability.

It must be noted here that while the technique is discussed for designing the wiring leads to have a multilayer structure in order to improve the corrosion resistivity of contact portions of buried Cu leads, this technique per se is known in the art to which the invention pertains. One method is as follows. Firstly bury a Cu film in a wiring lead groove. Then apply wet etching to the surface of this Cu film for recessing. Next, deposit a TiN film thereon by CVD or other similar suitable processes; thereafter, planarize the surface of resultant device structure. Unfortunately this approach does not come without accompanying a penalty: the Cu film can decrease in thickness for the entirety of wiring leads. This is because the entire part of the buried Cu leads must experience recess-etching. The Cu film thinning results in a likewise increase in electrical resistivity of the wiring leads. In contrast, the embodiment stated above is free from such risk of lead resistivity increase. This can be said because the TiN film is left only at the central portion of a buried Cu wiring lead with respect only to the contact portion. The "TiN film centralization" feature precludes any possible increase in on-chip lead resistance. In this respect, this embodiment is superior than the prior art.

This embodiment is also employable in the MIM capacitor-containing lead structures of Embodiments 1–2 stated supra. Note however that in this case, a need is felt to prevent a capacitor dielectric film from residing in the lead contact portion. Thus the process includes an additional step of etching the capacitor dielectric film.

Optionally the wiring lead and the lead contact portion as simultaneously formed in this embodiment may be modified to have a so-called "dual damascene" lead structure as in the wiring leads formed of third conductive film discussed previously.

Furthermore, although in Embodiments 1–3 the second conductor film is made of TiN, this is replaceable by other similar suitable materials including, but not limited to, titanium (Ti), tantalum (Ta), tantalum nitride (TaN), tungsten (W), and tungsten nitride (WN).

It has been stated that according to this invention, it is possible to obtain a semiconductor device having a preferable damascene on-chip wiring lead structure.

While the present invention has been particularly shown and described with reference to the specific embodiments thereof, it will be understood by those skilled in the art that various changes in form and details may be made without departing from the spirit, scope and teachings of the invention. The invention is, therefore, to be limited only as indicated by the scope of the appended claims.

What is claimed is:

1. A semiconductor device comprising:
   a semiconductor substrate;
   an insulative film formed above said semiconductor substrate, said film having a first groove and a second groove greater in width than the first groove;
   a wiring lead buried in the first groove of said insulative film to have a substantially flat surface;
   a capacitor buried in the second groove of said insulative film to have a substantially flat surface, said capacitor having a multilayer structure including a first conductive film identical in material to said lead, a capacitor dielectric film, and a second conductive film; and
   an extension lead from said first conductive film, said extension lead having an upper surface the same in level as an upper surface of said second conductive film.

2. The semiconductor device according to claim 1, wherein said second groove is greater in depth than said first groove.

3. The semiconductor device according to claim 1, wherein said second groove is substantially the same in depth as said first groove.

4. The semiconductor device according to claim 1, wherein a hole in which a conductor film to be connected to said second conductive film of said capacitor is buried is substantially the same in depth as another hole in which a conductor film to be connected to said lead is buried.

5. The semiconductor device according to claim 1, wherein said capacitor is such that said first conductive film, said capacitor dielectric film and said second conductive film are multilayered in this order of lamination sequence, and wherein said second conductive film has an upper surface substantially the same in level as an upper surface of said lead.

6. The semiconductor device according to claim 1, wherein each of said first conductive film and said capacitor dielectric film is recessed in to said second groove.

7. The semiconductor device according to claim 1, wherein said extension lead buried in a third groove of said insulative film.

8. The semiconductor device according to claim 7, wherein said third groove is substantially the same in width as said first groove.

9. A semiconductor device comprising:
   a semiconductor substrate;
   an insulative film formed above said semiconductor substrate, said film having a wiring groove with a widened contact portion formed therein; and
   a wiring lead with a first conductive film buried in the wiring groove, wherein
   said wiring lead has a structure with a second conductive film selectively covering an upper surface of said first conductive film at a central part of said contact portion and with said first conductive film being substantially planarly buried in said wiring groove at remaining part other than said contact portion, said second conductive film being electrically connected with said first conductive film.

10. The semiconductor device according to claim 9, wherein an upper surface of said second conductive film at the central part of said contact portion is substantially the same in level as the upper surface of said first conductive film other than said contact portion.

11. The semiconductor device according to claim 9, wherein a hole in which a conductor film to be connected to said contact portion is buried has a diameter less than a width of said second conductive film.

12. The semiconductor device according to claim 9, wherein said first conductive film at said contact portion has a recessed cross-sectional shape.

13. The semiconductor device according to claim 9, wherein said first conductive film is a Cu film and said second conductive film is a film made of at least one material selected from the group consisting of Ti, TiN, Ta, TaN, W, and WN.

14. A semiconductor device comprising:
   a semiconductor substrate;
   an insulative film formed above said semiconductor substrate, said film having a first groove and a second groove greater in width than the first groove;
   a wiring lead buried in the first groove of said insulative film to have a substantially flat surface; and
   a capacitor buried in the second groove of said insulative film to have a substantially flat surface, said capacitor having a multilayer structure including a first conductive film identical in material to said lead, a capacitor dielectric film, and a second conductive film,
   wherein said second groove is greater in depth than said first groove.

15. The semiconductor device according to claim 14, wherein a hole in which a conductor film to be connected to said second conductive film of said capacitor is buried is substantially the same in depth as another hole in which a conductor film to be connected to said lead is buried.

16. The semiconductor device according to claim 14, wherein said capacitor is such that said first conductive film, said capacitor dielectric film and said second conductive film are multilayered in this order of lamination sequence, and wherein said second conductive film has an upper surface substantially the same in level as an upper surface of said lead.

17. The semiconductor device according to claim 14, wherein each of said first conductive film and said capacitor dielectric film is recessed in to said second groove.

* * * * *